United States Patent [19]

Hsu

[11] Patent Number: 5,380,681
[45] Date of Patent: Jan. 10, 1995

[54] THREE-DIMENSIONAL MULTICHIP PACKAGE AND METHODS OF FABRICATING

[75] Inventor: Chen-Chung Hsu, Taichung, Taiwan, Prov. of China

[73] Assignee: United Microelectronics Corporation, Hsinchu, Taiwan, Prov. of China

[21] Appl. No.: 214,990

[22] Filed: Mar. 21, 1994

[51] Int. Cl.6 .......................................... H01L 21/60
[52] U.S. Cl. .................................. 437/209; 437/208; 437/211; 437/915
[58] Field of Search ............... 437/208, 209, 211, 214, 437/215, 217, 218, 219, 220, 915; 257/686

[56] References Cited

U.S. PATENT DOCUMENTS

| | | | |
|---|---|---|---|
| 4,807,021 | 2/1989 | Okumura | 357/75 |
| 4,983,533 | 1/1991 | Go | 437/915 |
| 5,075,253 | 12/1991 | Sliwa, Jr. | 437/209 |
| 5,135,878 | 8/1992 | Bartor | 437/208 |
| 5,155,067 | 10/1992 | Wood et al. | 437/211 |
| 5,191,405 | 3/1993 | Tomita et al. | 257/777 |
| 5,202,754 | 4/1993 | Bertin et al. | 257/684 |
| 5,227,338 | 7/1993 | Kryzaniwsky | 437/211 |
| 5,270,261 | 12/1993 | Bertin et al. | 437/208 |
| 5,281,852 | 1/1994 | Normington | 437/208 |
| 5,308,782 | 5/1994 | Mazuré et al. | 437/915 |

Primary Examiner—Brian E. Hearn
Assistant Examiner—Kevin M. Picardat
Attorney, Agent, or Firm—George O. Saile; Wolmar J. Stoffel

[57] ABSTRACT

A process for fabricating a three-dimensional multi-chip array package wherein master semiconductor substrate is formed having a peripheral inner row of contact pads and a peripheral outer row of terminal pads. A plurality of subordinate semiconductor substrates are formed provided with a peripheral row of contact pads that match the contact pads on the master substrate. Openings are formed through centers of the contact pads that extend through the subordinate substrates. The subordinate substrates are stacked on the master substrate with the openings in alignment over the contact pads. The openings are then filled with a conductive material to interconnect the contact pads on all its substrates.

17 Claims, 8 Drawing Sheets

THREE-DIMENSIONAL MULTICHIP PACKAGE AND METHODS OF FABRICATING

BACKGROUND OF THE INVENTION

(1) Field of the Invention

The present invention relates in general to high density electronic devices, more particularly to a device structure that embodies a three dimensional multichip array interconnected and supported on a base semiconductor device substrate, and methods of fabricating.

(2) Description of the Related Art

Since the development of integrated circuit technology, semiconductor devices have been made from monocrystalline semiconductor materials, i.e. silicon, that has been crystallized from molten silicon into a single crystal boule. The boule is sliced into wafers, the wafers polished, and semiconductor elements formed and interconnected with metallurgy stripes. The wafers are divided into devices, which are electrically bonded to carriers of various types. Electrical connections are made to the devices by either, solder bumps, aluminum ultrasonic bonding, gold bumps, thermal compressions bonded wires, decals, etc. As the devices become more microminiaturized, the electrical connections become more difficult, and the yield decreased. When the size of the devices were made larger the yield decreased since there were more possibilities for defects in a single device. Further, long lines presented effective power input and frequently produced undesirable signal delays.

Efforts to overcome these problems led to connecting IC (Integrated Circuit) devices directly to each other, instead of each device to a support package, and connecting the support package. U.S. Pat. Nos. 4,807,021 and 5,202,754 are illustrative of such efforts. However, the fabrication of such multiple device packages provided to be difficult, painstaking, and expensive. U.S. Pat. No. 5,191,405 discloses a variation consisting of a three-dimensional stacked LSI (Large Scale Integration) having a plurality of integrated circuit layers stacked together and electrically connected with interlayer via hole wiring.

SUMMARY OF THE INVENTION

An object of this invention is to provide a new semiconductor structure, and method of fabricating, that will provide higher levels of microminiturization, less power dissipation, and less signal delay than comparable structures, and greater case of fabrication.

Another object of the invention is to provide a new method of fabricating three-dimensional stacked integrated circuit device structures that are easier and simpler to perform, less expensive and capable of higher yields.

In accordance with the invention there is provided a three-dimensional multichip array package with a master semiconductor device supporting and electrically interconnected with a stacked array of subordinate semiconductor devices. In the package a master semiconductor substrate is provided with interconnected device elements and circuitry connected to an inner peripheral row of contact pads and an outer row of terminal pads. A plurality of subordinate semiconductor devices, in a stacked array, are supported on the master device. Each semiconductor device is provided with contact pads arranged in a peripheral pattern that corresponds to the pattern on the master device. An opening extents through the contact pads which is filled with a conductive metal material.

There is also provided a process for fabricating a three-dimensional multichip array package where integrated circuit elements, inner peripheral contact pads, and outer peripheral terminal pads are formed on a master semiconductor substrate. Integrated circuit elements and interconnected contact pads are also formed on a plurality of subordinate semiconductor substrates. Central openings are formed through the contact pads, the subordinate substrate stacked on the master substrate, and the central openings filled with a conductive material.

DESCRIPTION OF THE PREFERRED EMBODIMENTS

Figure 1:
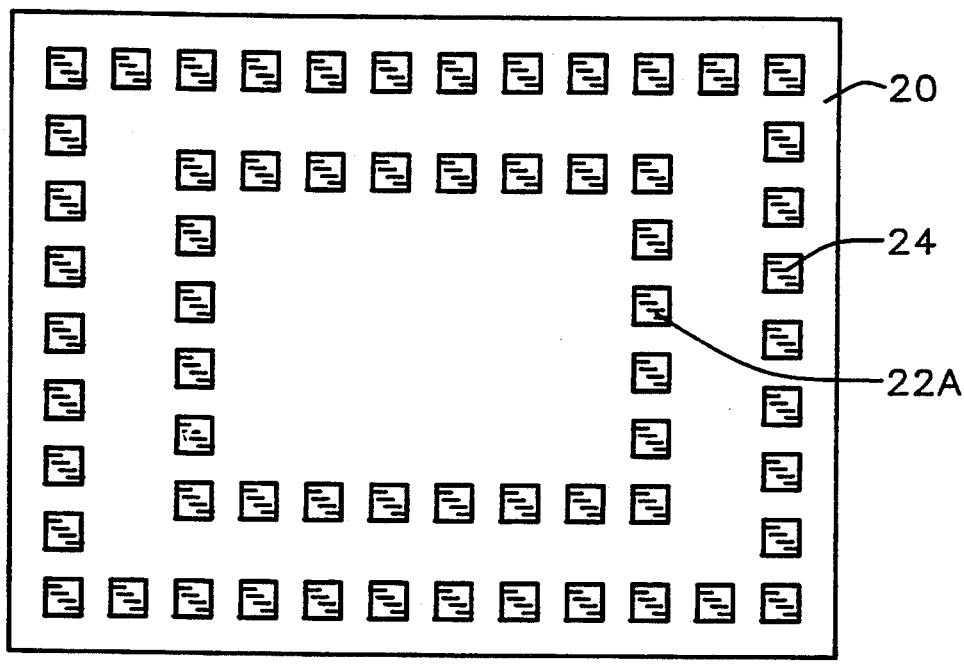
FIG. 1 is a top view of a master device before assembly.
Figure 2:
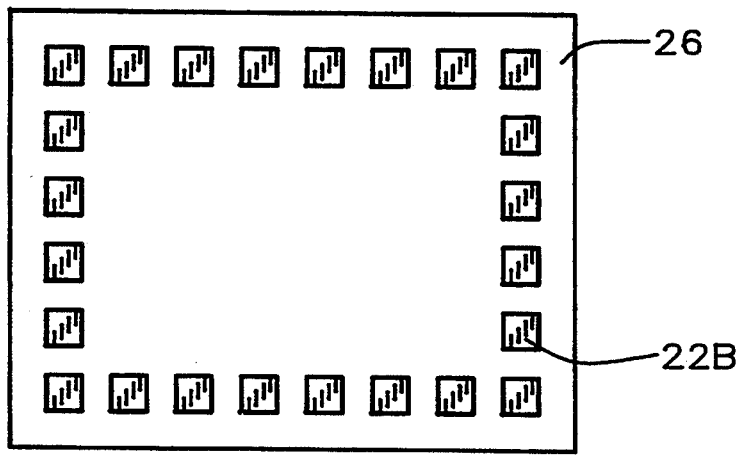
FIG. 2 is a top view of a subordinate device before assembly.

Embodiments of the invention will be described with reference to the accompanying drawings. FIG. 1 illustrates a master semiconductor substrate 20 formed of monocrystalline semiconductor material, typically silicon. Substrate 20 has integrated circuit elements (not shown) fabricated in at east the central portion of the substrate that are surrounded by an inner peripheral row of contact pads 22A. Pads 22A are preferably AL (Aluminum), but can be formed of other conductive metals if desired. An outer peripheral row of terminal pads 24 are provided on substrate 20 that are spaced outwardly from contact pads 22A. The technology to form the circuit elements and pads on substrate 20 is known and per se does not constitute a part of this invention. As shown in FIG. 2 a plurality of subordinate semiconductor substrates 26 are then fabricated. Substrates 26 are also formed of semiconductor material, preferably monocrystalline Silicon. Each of substrates 26 has interconnected integrated circuit elements (not shown) thereon, surrounded by a peripheral row of contact pads 22B, arranged in a pattern that corresponds to the pattern of contact pads 22A on substrate 20. Contact pads 22B are interconnected to the circuit elements. The pads 22B are preferably formed of A1, but could be other metals if desired. The pads 22A and 22B are shown as being square in shape, but can be circular in shape, if desired.

Figure 6:
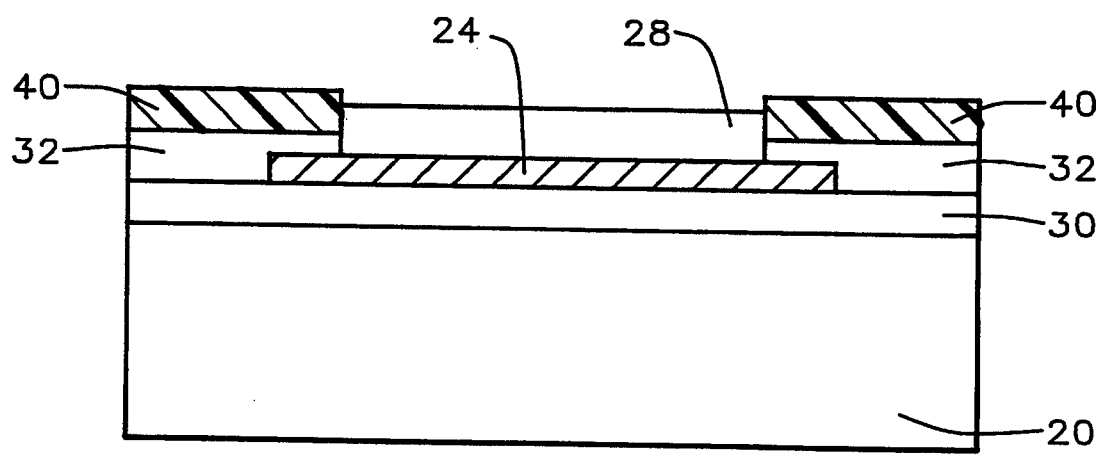
FIG. 6, 7 and 8 is a sequence of cross sectional view a terminal pad at various stages of fabrication.
Figure 7:
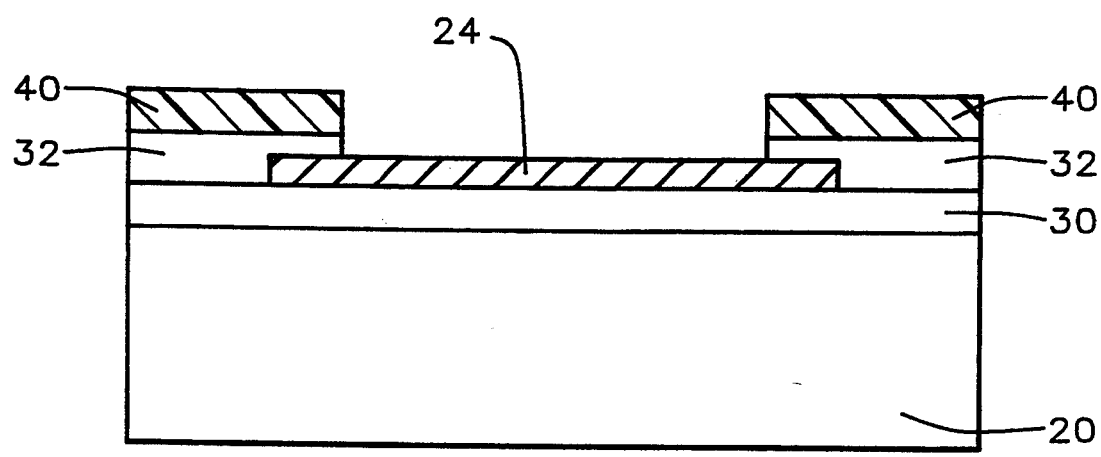

Referring now to FIG. 6, the terminal pads 24 on substrate 20, are covered with a thin protective layer 28, preferably of silicon nitride. The surface of substrate 20 also has an overlying insulating layer 30 that also overlaps the circuit elements and insulates the overlying metallurgy layer (not shown) from the substrate. A dielectric layer 32, preferably silicon oxide (SiO$_2$) protects the metallurgy layer on substrate 20. Openings for terminal pads 24 are formed in layer 32. Protective layer 28 of silicon nitride can be formed over terminal pads 24 by plasma enhanced chemical vacuum deposition (PECVD) on the terminal pads, contact pads and polyimide surfaces. The layer is now patterned using photoresist lithography and etching techniques to etch the contact pads and the polyimide layer. Only the terminal pads are now covered by the silicon nitride layer 28 after this patterning procedure. The thickness of the silicon nitride layer is less than the thickness of the polyimide layer.

Figure 8:
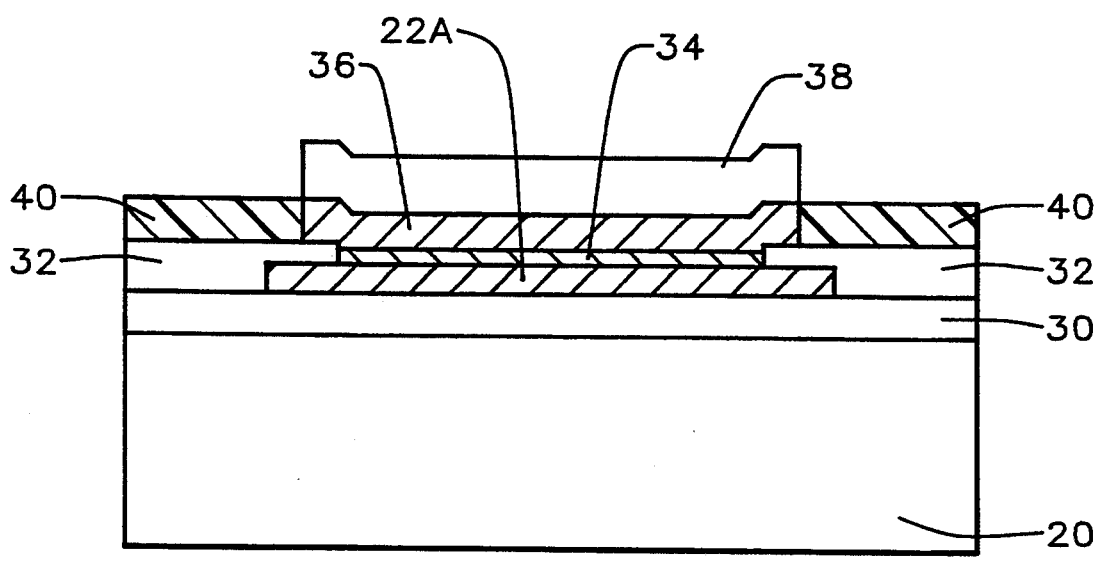

The contact pads 22A on substrate 20 are given a different treatment, as illustrated in FIG. 8. Preferably a titanium (Ti) layer 34 and a barrier layer 36 are deposited over contact pad 22A. Barrier layer 36 can be made of copper, palladium, tungsten, or similar material. A gold layer 38 is deposited over barrier layer 34, preferably by electrodeposition, since terminal pads 24 are protected by layer 28. The structure is illustrated in FIG. 8. A layer 40 of an organic material, most preferably polyimide, is deposited on the top and bottom surfaces of the subordinate and master substrates. The polyimide layer can be deposited by normal coating techniques. The thickness of layer 40 is typically in the range of 5 to 10 micrometers.

Referring now to FIGS. 9 through 12, the procedure for preparing subordinate substrate 26 for stacking to form an array is shown. Substrate 26 have a top surface layer 30 of SiO$_2$, and an overlying dielectric layer 32, similar to layers 30 and 32 on master substrate 20. An overlying layer 40 of organic material is deposited over layer 32, as done on master substrate 20. Preferably layers 32 and 40 are deposited over the top surface of subordinate substrate 26, including contact pad 22B.

Figure 9:
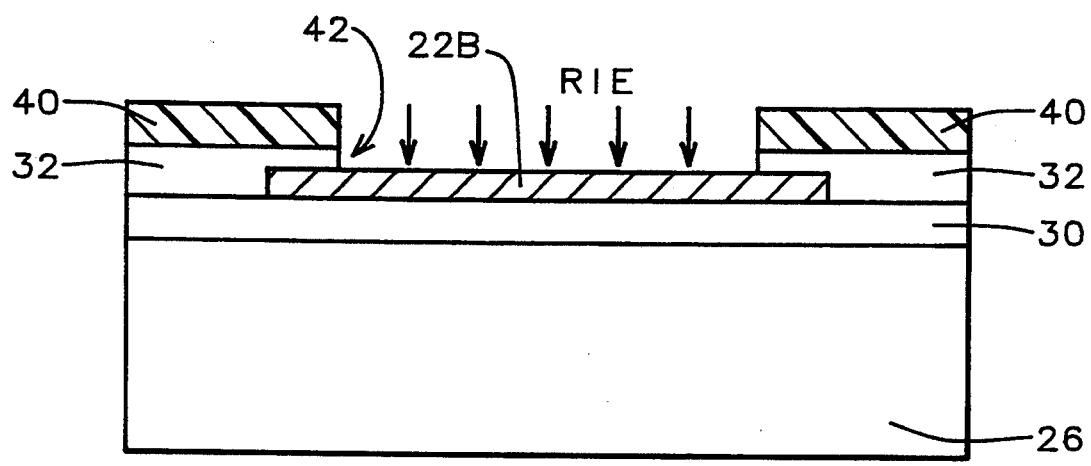
FIG. 9 through 12 is a sequence of cross sectional views of a contact pad on a subordinate device at various stages of fabrication.
Figure 10:
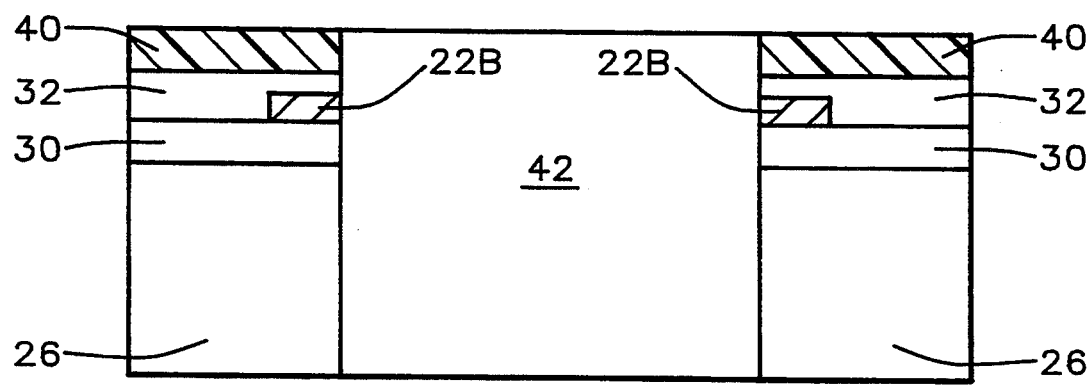

The subordinate substrate 26 is chemical mechanically polished (CMP) from the back side to a thickness of between about 5 to 10 mils. An opening 42 is formed to expose pad 22B, as shown in FIG. 9. Note that the opening 42 is smaller than pad 22B. The control opening 42 is continued downwardly through subordinate substrate 26, as shown in FIG. 10. Opening 42 is preferably formed by reactive ion etching (RIE). The thinner substrate after the CMP makes the RIE process easier.

The pad 22B is larger than central opening 42 so that the edge of the pad is exposed, as shown in FIG. 10. When circular pads 22B are provided, the diameter of pads 22B is typically in the range of between about 30 to 60 micrometers. The diameter of the opening 42 is typically in the range of about 20 to 50 micrometers.

Figure 11:
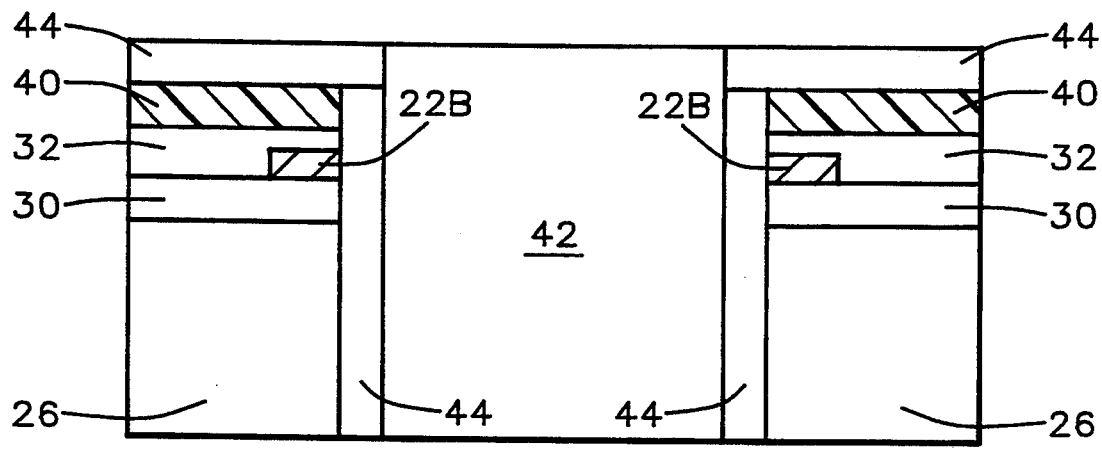

As shown in FIG. 11, a conformal layer 44 of dielectric material is deposited on the top surface of substrate 26 and on the inside surfaces of central openings 42. This layer can be dielectric material, such as silicon nitride, silicon oxide or the like. Layer 44 can be deposited by PECVD technology as is understood in the art. The thickness of layer 44 is typically in the range of between about 3000 to 12000 Angstroms.

Figure 12:
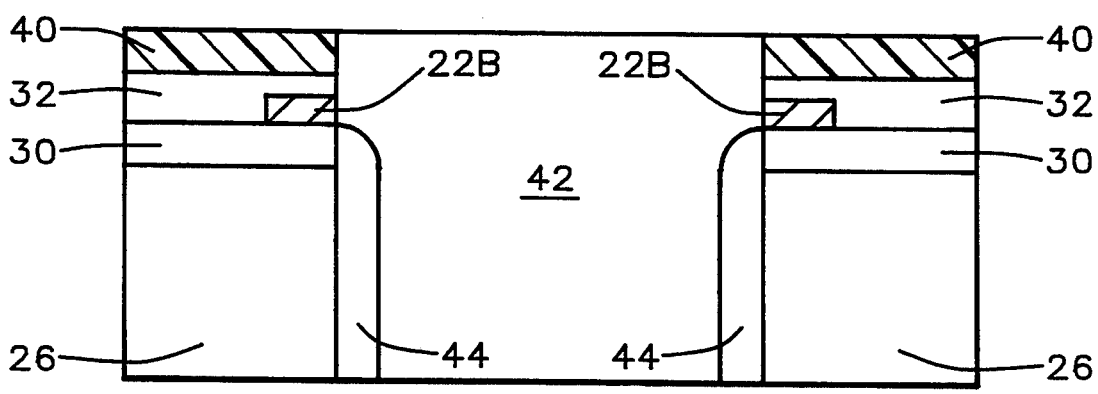

As shown in FIG. 12, layer 44 is anisotropically etched to remove layer 44 from the top surface of substrate 26, and the top edge of layer 44 in the opening to expose the edge of contact pad 22B. The etching must be directional, i.e. in a vertical direction. The etching is accomplished by anisotropic reactive ion etching (RIE).

Figure 13:
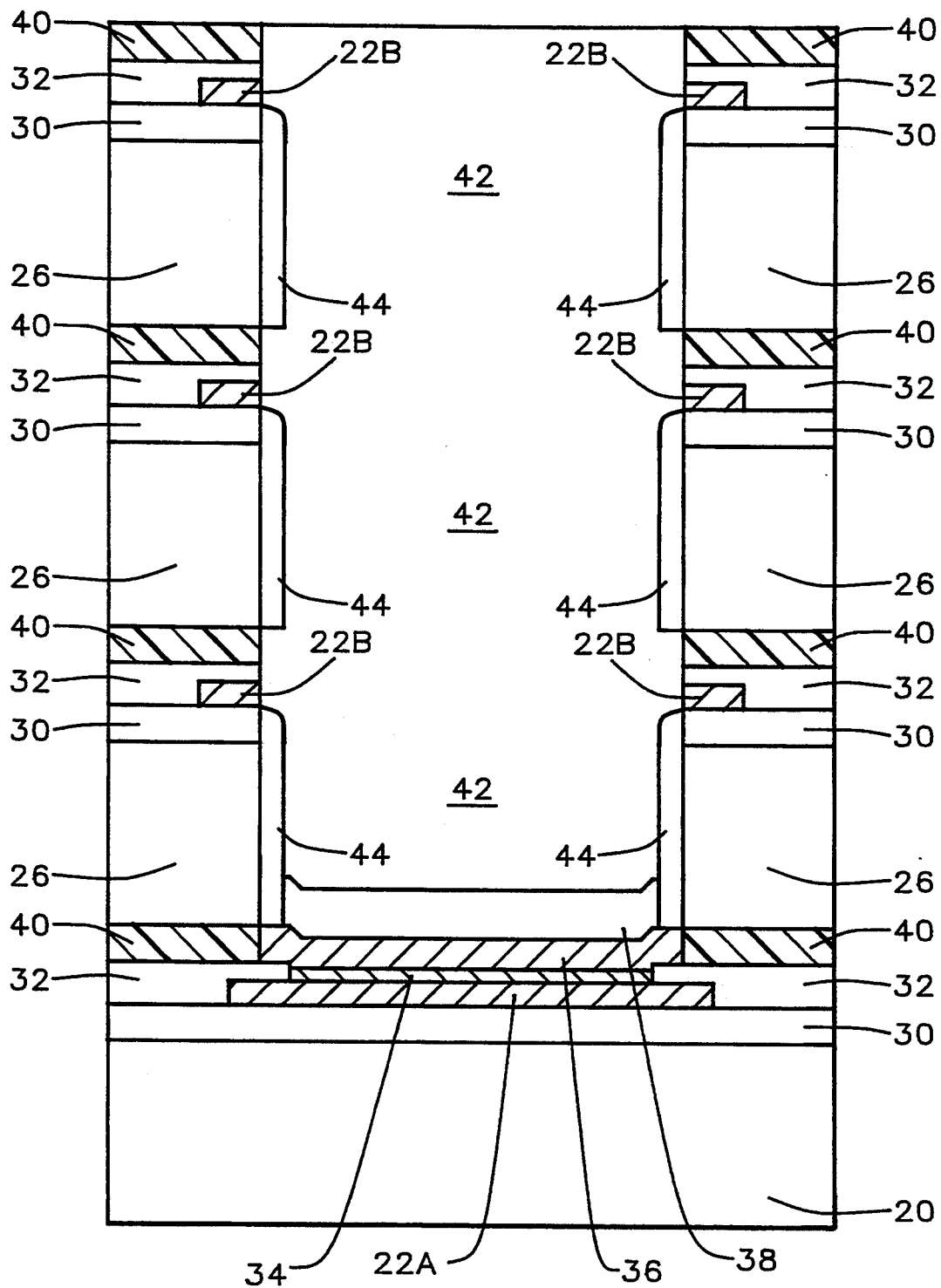
FIG. 13 and 14 is a sequence of cross sectional views of a stacked array of subordinate devices taken of a contact pad interconnecting at various stages of fabrication.
Figure 14:
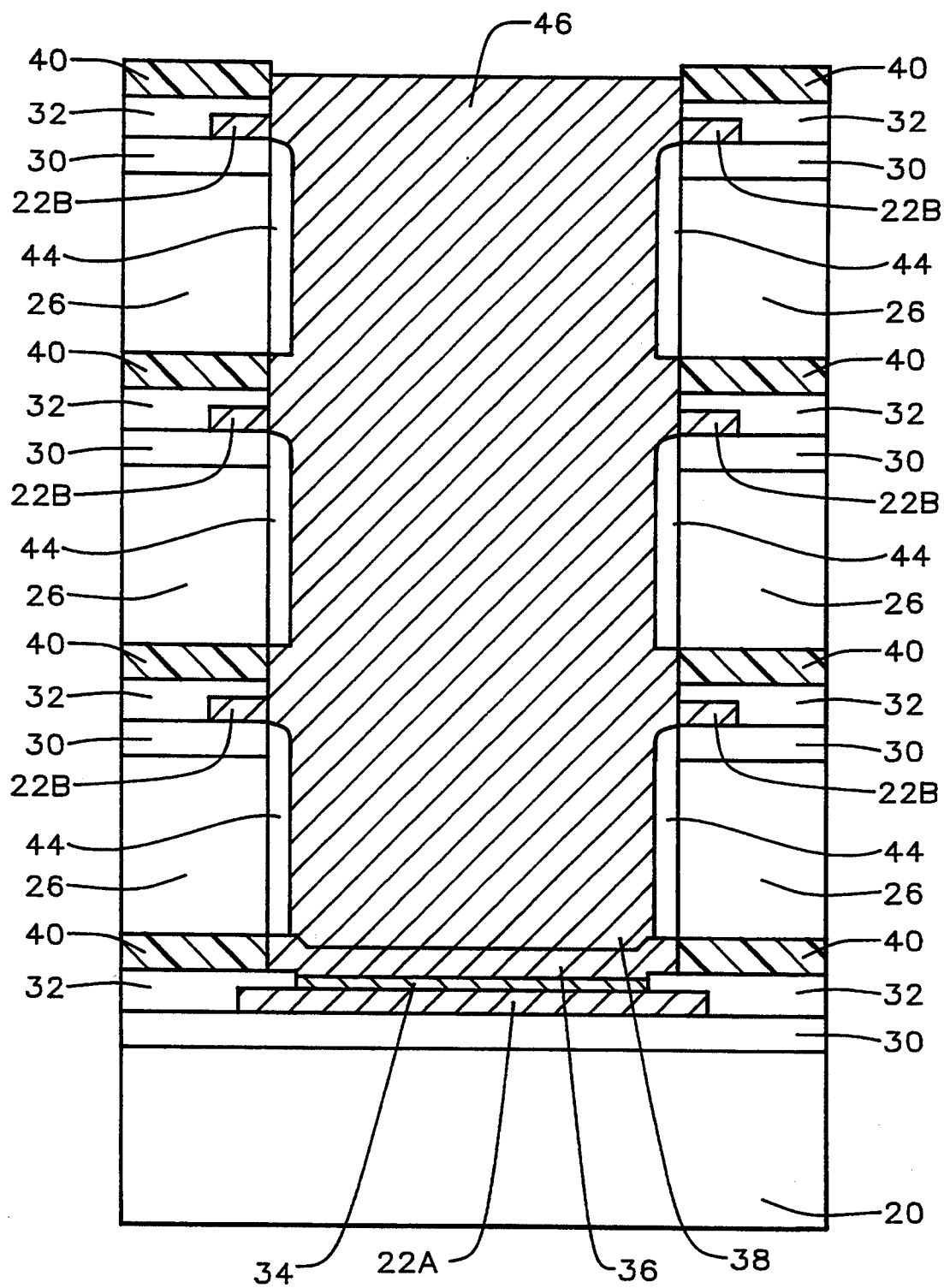

The subordinate semiconductor substrates 26 are then stacked one on the other on the master substrate 20 with the central openings in pads 22B in alignment over contact pads 22A on master substrate 20. The substrates and polyimide layer 40 are connected by thermocompression bonding. FIG. 13 shows a cross-sectional view of the central opening pads. Note that the edges of pads 22B are exposed inside of the opening. As shown in FIG. 14, the openings 42 is filled with a conductive material 46 to thereby electrically convert the corresponding pads 22B of substrate 26 to corresponding pads 22A of master substrate 20.

The conductive material 46 is preferably gold, which can be deposited by electroplating techniques. The silicon nitride layer 28 provides protection during electroplating to pads 24 on substrate 20. The selective electroplating is a chemical reaction technique. A gold source is positioned at the master substrate 20 in a suitable electroplating bath. The electroplating process is begun and continued until the gold has filled the follow pads and connect to all of the pads 22B in the stack as seen in FIG. 14. After the electroplating of the openings is completed, layer 28 is removed, as shown in FIG. 6.

Figure 3:
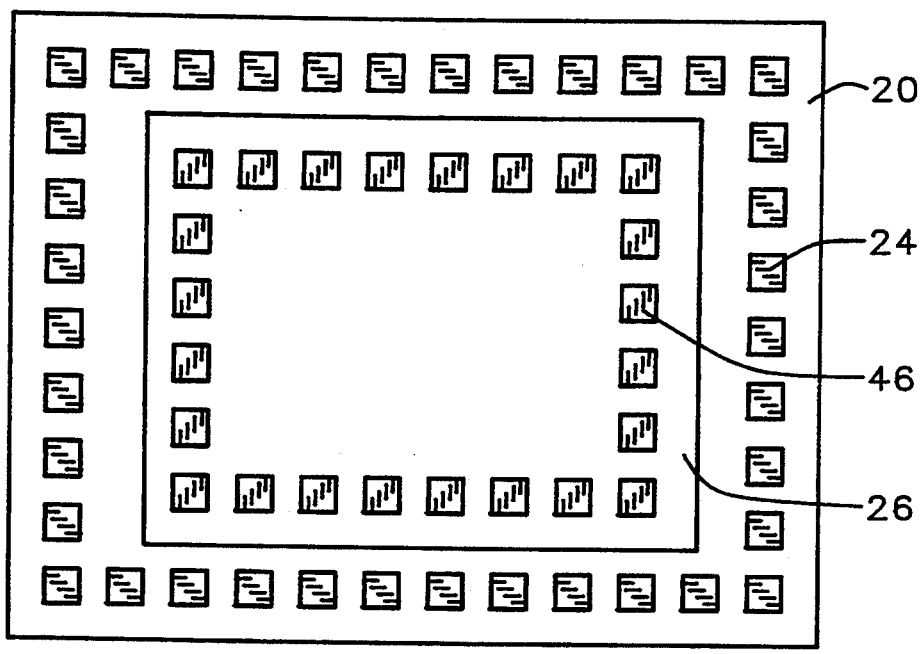
FIG. 3 is a top view of the assembled master device and for array of subordinate devices.
Figure 4:
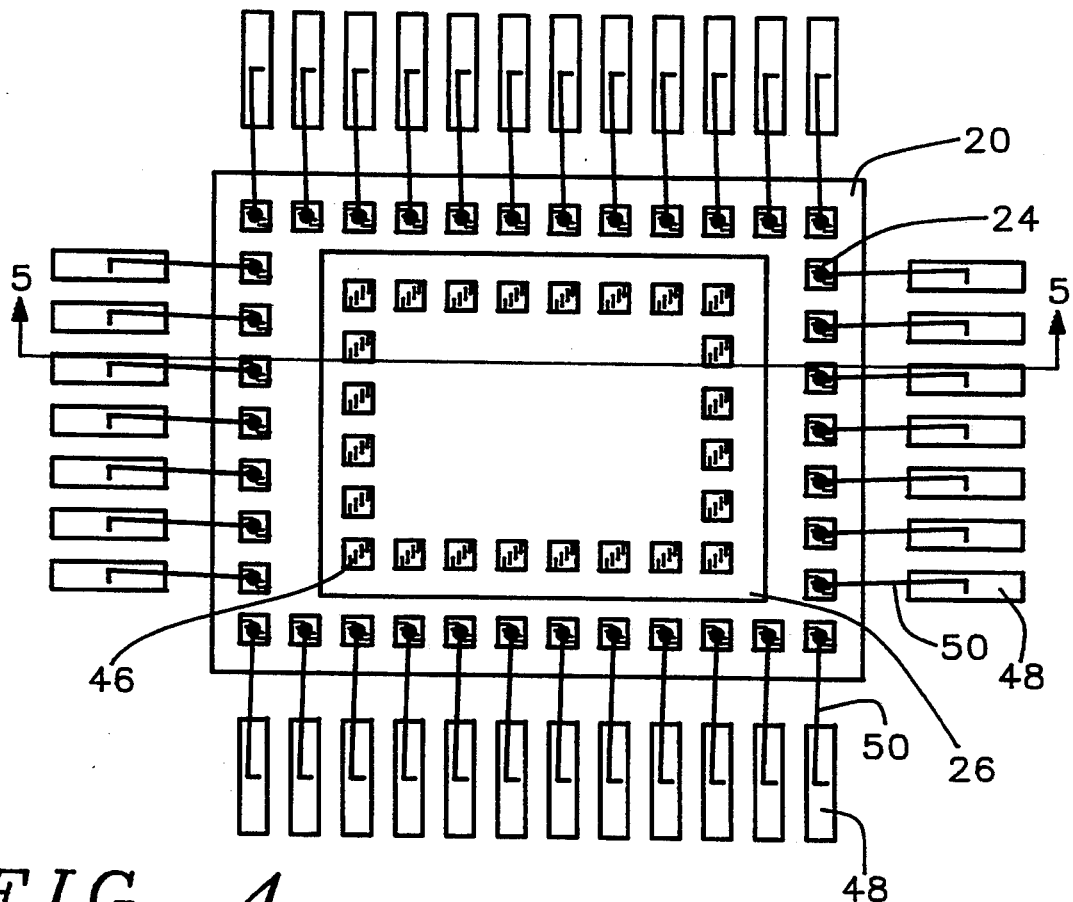
FIG. 4 is a top view of the assembled package shown connected to the terminals of a semiconductor package structure.
Figure 5:
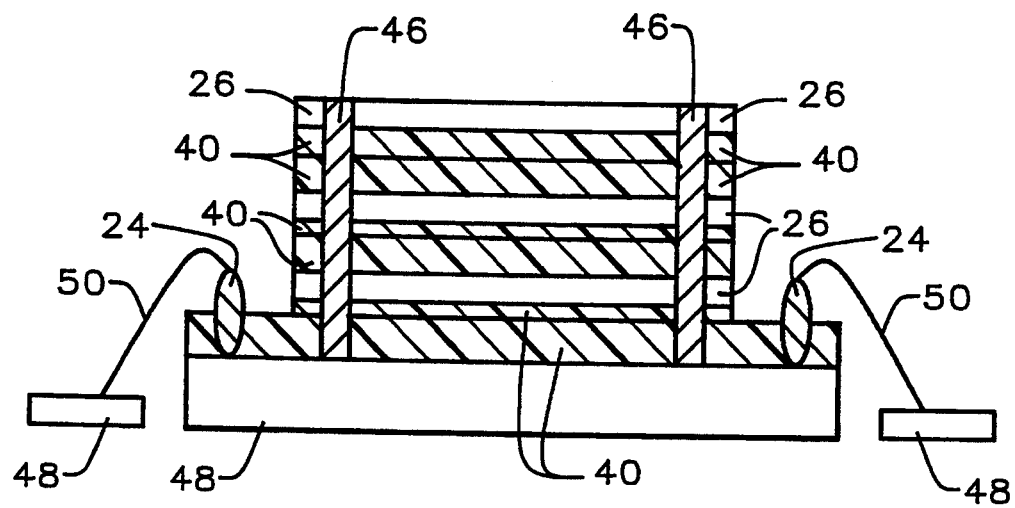
FIG. 5 is a cross sectional view of FIG. 4 taken on line 5—5 of FIG. 4.

The resultant three dimensional array package is shown in FIG. 3. The package is also shown in FIG. 4 and FIG. 5 electrically connected to the lead frame terminals 48 of package. The connection is shown made with Au wires 50 ultrasonically bonded to terminals 48 and terminal pads 24 on substrate 20.

The three dimensional array package of the invention solves many of the problems of comparable packages known to the prior art. The signal propagation delay time is shortened and the power is reduced because the vertical wiring is shorter and thicker. The process of fabricating the array are relatively simple, and the number of steps are reduced. This reduces the cost and increases the yield. Further the structure is particularly suited for ultra-parallel processing since it allows a number of signals in the same plane to be simultaneously transferred between layers.

The multichip package of the present invention can be used to expand the low power memory size of certain devices. For example, commonly the memory device includes memory cell and peripheral control circuitry. We can use the multichip technology of this invention to separate the low power memory device into two parts. In the first part, the master chip is used as the memory peripheral control circuitry. In the second part, the subordinate multichips can be used to connect memory cells to the master chip from the central contact pads.

While the invention has been particularly shown and described with reference to the preferred embodiments thereof, it will be understood by those skilled in the art that various changes in form and details may be made without departing from the spirit and scope of the invention.

What is claimed is:

1. A process for fabricating a three-dimensional multichip array package having an integrated circuit (IC) master semiconductor device supporting and interconnected with a densely stacked array of subordinate integrated circuit semiconductor devices, comprising:

fabricating interconnected integrated circuitry elements electrically connected to a plurality of contact terminal pads arranged in an inner peripheral row on a master semiconductor substrate to form a master device;

forming a plurality of lead terminal pads on the master device arranged in an outer peripheral row and electrically connected to the inner row of contact terminal pads;

forming an insulating layer of an organic material over the surface of the master device;

etching openings over the contact terminal pads and the lead terminal pads;

depositing a barrier metal layer and a gold layer over the contact terminal pads;

fabricating interconnected integrated circuitry elements that are electrically connected to contact terminal pads arranged in a peripheral row on subordinate semiconductor substrate to form a plurality of subordinate integrated circuit semiconductor devices, the pattern of the contact pad terminals matching the pattern of the contact pad terminals on the master devices;

depositing an insulating layer of an organic material over the surfaces of each subordinate integrated circuit semiconductor devices;

etching control openings through each of the contact terminal pads and substrates of the plurality of subordinate semiconductor devices, the central openings of a size less than the size of the contact terminal pads;

depositing a thin conformed dielectric layer over the surfaces of said subordinate semiconductor devices and on the surfaces of the central openings;

anisotropically etching away the conformed dielectric layer on the surfaces of said subordinate semiconductor devices and the top edges of the dielectric layer in the central openings to a depth sufficient to expose edge surfaces of the contact terminal pads;

stacking the plurality of said subordinate semiconductor devices on said master semiconductor devices with the central openings of said subordinate semiconductor devices aligned over the row of contact terminal pads on the master semiconductor device; and filling the openings with a conductive material to electrically interconnect the plurality of subordinate semiconductor devices and the master semiconductor device.

2. The process of claim 1 wherein semiconductor substrates of said subordinate semiconductor devices are thinned prior to etching the central openings.

3. The process of claim 2 wherein the central openings are filled with gold.

4. The process of claim 3 wherein said gold is formed in the central openings by electroplating.

5. The process of claim 2 wherein the layer of organic material deposited on said subordinate semiconductor devices and said master semiconductor device is polyimide.

6. The process of claim 5 wherein the thickness of the polyimide layer is between about 5 to 10 micrometers.

7. The process of claim 1 wherein the Integrated circuit elements on said subordinate semiconductor devices and said master semiconductor devices are covered with a insulating layer.

8. The process of claim 7 wherein said insulating layer is layer of silicon oxide.

9. The process of claim 8 wherein the thickness of the silicon oxide layer is between about 3000 to 12000 Angstroms.

10. The process of claim 2 wherein the barrier layer is a layer of titanium overlying a layer of copper.

11. The process of claim 1 wherein said contact pads are circular in shape with the diameter of the contact terminal pads is between about 30 to 60 micrometers.

12. The process of claim 11 wherein the diameter of the central openings is between about 20 to 50 micrometers.

13. A process of claim 2 wherein the contact pads are formed of Aluminum.

14. A process of claim 2 wherein the material of the conformed dielectric layer is silicon nitride.

15. The process of claim 14 wherein the conformed dielectric layer is deposited by plasma enhanced chemical vapor deposition.

16. The process of claim 15 wherein the thickness of the conformed dielectric layer is between about 6000 to 12000 Angstroms.

17. The process of claim 14 wherein the conformed to dielectric layer is etched by directional reactive ion etching.

* * * * *